(12) United States Patent
Kumaki et al.

(10) Patent No.: US 9,832,886 B2
(45) Date of Patent: Nov. 28, 2017

(54) METHOD FOR FORMING WIRING

(71) Applicant: National University Corporation Yamagata University, Yamagata-shi, Yamagata (JP)

(72) Inventors: Daisuke Kumaki, Yamagata (JP); Shizuo Tokito, Yamagata (JP); Yu Kobayashi, Yamagata (JP); Shohei Norita, Yamagata (JP)

(73) Assignee: NATIONAL UNIVERSITY CORPORATION YAMAGATA UNIVERSITY, Yamagata (JP)

( * ) Notice: Subject to any disclaimer, the term of this patent is extended or adjusted under 35 U.S.C. 154(b) by 0 days.

(21) Appl. No.: 15/125,037

(22) PCT Filed: Mar. 5, 2015

(86) PCT No.: PCT/JP2015/001198
§ 371 (c)(1),
(2) Date: Sep. 9, 2016

(87) PCT Pub. No.: WO2015/136900
PCT Pub. Date: Sep. 17, 2015

(65) Prior Publication Data
US 2017/0020006 A1    Jan. 19, 2017

(30) Foreign Application Priority Data

Mar. 11, 2014   (JP) .................................. 2014-047549

(51) Int. Cl.
*H05K 3/00* (2006.01)
*H05K 3/40* (2006.01)
(Continued)

(52) U.S. Cl.
CPC ....... *H05K 3/4038* (2013.01); *H01L 23/5226* (2013.01); *H05K 3/105* (2013.01);
(Continued)

(58) Field of Classification Search
CPC ......... H01L 21/02491; Y10T 29/49124; Y10T 428/10; Y10T 428/1005; Y10T 428/24802;
(Continued)

(56) References Cited

U.S. PATENT DOCUMENTS 5,612,235 A * 3/1997 Wu ..................... H01L 27/1214
                                                257/E21.414
6,423,934 B2   7/2002 Hasegawa et al.
(Continued)

FOREIGN PATENT DOCUMENTS

JP    7-130734    5/1995
JP    7-221095    8/1995
(Continued)

*Primary Examiner* — Thiem Phan
(74) *Attorney, Agent, or Firm* — Hamre, Schumann, Mueller & Larson, P.C.

(57) ABSTRACT

A method for forming a wiring according to the present invention includes: applying an ink (6) that exhibits electrical conductivity upon light absorption to a contact hole formation portion of an upper face of an insulating resin layer (3) formed on a lower wiring element (2); and irradiating the ink (6) with light to render the ink (6) conductive and also to remove a part of the insulating resin layer (3) by heat emitted from the ink (6) so as to form a contact hole (5), the part of the insulating resin layer (3) lying under the portion of the face to which the ink (6) is applied. A step of forming an upper wiring element (4) on the upper face of the insulating resin layer (3) may further be carried out, the upper wiring element (4) being electrically continuous with the lower wiring element (2) through the contact hole (5).

20 Claims, 6 Drawing Sheets

(51) Int. Cl.
 *H05K 3/10* (2006.01)
 *H01L 23/522* (2006.01)
 *H05K 1/09* (2006.01)
 *H01L 21/768* (2006.01)

(52) U.S. Cl.
 CPC ...... *H05K 3/4069* (2013.01); *H01L 21/76802* (2013.01); *H05K 1/092* (2013.01); *Y10T 29/49124* (2015.01)

(58) Field of Classification Search
 CPC .... B41C 1/1008; B41C 1/1033; H05K 1/097; H05K 3/102; H05K 3/107; H05K 3/125; H05K 3/1258
 USPC .......................... 29/829, 825, 846, 848, 852
 See application file for complete search history.

(56) References Cited

U.S. PATENT DOCUMENTS

| | | | |
|---|---|---|---|
| 7,727,847 B2 | 6/2010 | Tanaka et al. | |
| 8,183,067 B2 * | 5/2012 | Yamazaki | H01L 27/1214 438/29 |
| 2005/0285989 A1 | 12/2005 | Sakurai et al. | |

FOREIGN PATENT DOCUMENTS

| | | |
|---|---|---|
| JP | 9-082803 | 3/1997 |
| JP | 2006-011162 | 1/2006 |
| JP | 3880242 B | 2/2007 |
| JP | 2008-077074 | 4/2008 |
| JP | 5145687 B | 2/2013 |
| JP | 2013-223837 | 10/2013 |
| JP | 5408878 B | 2/2014 |
| WO | 2006/071419 | 7/2006 |

\* cited by examiner

METHOD FOR FORMING WIRING

TECHNICAL FIELD

The present invention relates to a method for forming a wiring.

BACKGROUND ART

Conductive inks can be formed into wiring elements by film formation through coating, and this allows a considerable reduction in cost and environmental load as compared to the case of conventional vacuum processes. Conductive inks have therefore been ranked as industrially very important technical means, and the development of their materials has been actively pursued.

For example, there have recently been developed metal nanoparticle inks that exhibit a high electrical conductivity of $10^{-5}$ $\Omega \cdot cm$ or less when sintered at a temperature of 150° C. or lower. The use of such inks allows various electronic circuits to be formed even on plastic films having low heat resistance.

In forming wiring elements of an electronic circuit, it may be necessary to form a contact hole for providing electrical contact between a lower wiring element formed on a substrate and an upper wiring element insulated by an insulating layer formed from a resin or the like on the lower wiring element.

In the case of conventional silicon semiconductor devices, the formation of a contact hole is accomplished using a lithography technique and an etching technique. An example of conventionally-used methods is one in which a resist pattern is formed by photolithography and then a contact hole is formed, for example, by dry etching using a reactive plasma gas. However, combining such a method using dry etching with a printing device poses difficulty in terms of cost since the dry etching is a vacuum process.

As for an example of contact hole formation methods free of any vacuum process and applicable to printing devices, Patent Literature 1 discloses a method that uses laser ablation to form a through hole (contact hole).

In addition, Patent Literature 2 discloses a method in which a conductive ink is first applied onto a lower wiring pattern in such a manner that the conductive ink will form island-shaped projections protruding from an insulating layer, and then the insulating layer and an upper wiring element are stacked.

As for a method for forming a wiring by printing, Patent Literature 3 proposes a method that uses a metal nanoparticle ink and in which the ink is sintered by light irradiation with a flash lamp.

CITATION LIST

Patent Literature

Patent Literature 1: JP 3880242 B
Patent Literature 2: JP 5145687 B
Patent Literature 3: JP 5408878 B

SUMMARY OF INVENTION

Technical Problem

Among conventional contact hole formation methods as mentioned above, methods using a lithography technique and an etching technique are wasteful and by no means efficient, because these methods consist of many steps and require the use of a resist which is to be finally peeled and removed. Moreover, methods using dry etching or the like are difficult to apply to printing processes, as noted above.

Methods using laser ablation have a disadvantage in that the ablation causes a decomposition product to scatter around the contact hole, which makes the occurrence of defects more likely. In addition, when a transparent resin film, which has a low absorbance index, is subjected to ablation process, the low absorbance index renders the process difficult and makes it likely that the lower wiring element is damaged by unabsorbed light energy. If a short-wavelength ultraviolet laser is employed to improve the ease of processing, a problem arises in that the optical system used becomes expensive and the processing cost significantly increases.

Methods as described in Patent Literature 2 involve difficult control of the geometry of island-shaped projections formed by the conductive ink and have difficulty achieving a size reduction of the contact hole or a thickness increase of the insulating layer.

There has therefore been a demand for a method that allows easy formation of a contact hole and that is also applicable to micro-integrated circuits.

The present invention aims to provide a method for forming a wiring that allows easy formation of a contact hole or easy establishment of direct connection between wiring elements and that is suitable for use in formation of a semiconductor integrated circuit or the like by a printing process.

Solution to Problem

The present invention provides a method for forming a wiring having a structure in which wiring elements between which an insulating resin layer is interposed are connected via a contact hole, the method including:

applying an ink that exhibits electrical conductivity upon light absorption to a contact hole formation portion of an upper face of the insulating resin layer formed on a lower wiring element; and irradiating the ink with light to render the ink conductive and also to remove a part of the insulating resin layer by heat emitted from the ink so as to form the contact hole, the part of the insulating resin layer lying under the portion of the face to which the ink is applied.

In another aspect, the present invention provides a method for for forming a wiring having a structure in which wiring elements between which an insulating resin layer is interposed are connected via a contact hole, the method including:

applying an ink that exhibits electrical conductivity upon light absorption to a contact hole formation portion of an upper face of a lower wiring element;

forming the insulating resin layer on the lower wiring element after the application of the ink; and irradiating the ink with light from outside of the insulating resin layer to render the ink conductive and also to remove a part of the insulating resin layer by heat emitted from the ink so as to form the contact hole, the part of the insulating resin layer lying above the portion of the face to which the ink is applied.

In still another aspect, the present invention provides a method for forming a wiring by connecting wiring elements between which an insulating resin layer is interposed, the method including:

applying an ink that exhibits electrical conductivity upon light absorption to an upper face of the insulating resin layer formed on a lower wiring element, the ink serving as an upper wiring element; and irradiating the ink with light to render the ink conductive and also to remove a part of the insulating resin layer by heat emitted from the ink so as to connect the lower wiring element and the upper wiring element together, the part of the insulating resin layer lying under a portion of the face to which the ink is applied.

In still another aspect, the present invention provides a method for producing an electronic device, the method including forming a wiring by any one of the above methods.

Advantageous Effects of Invention

According to the present invention, a contact hole can easily be formed by light irradiation-induced sintering of a conductive ink. According to the present invention, direct connection between wiring elements between which an insulating resin layer is interposed can also easily be achieved by light irradiation-induced sintering of a conductive ink. Thus, the methods according to the present invention can be preferably used for formation of a fine wiring, in particular for formation of a semiconductor integrated circuit or the like by a printing process, and can contribute to efficient production of electronic devices.

DESCRIPTION OF EMBODIMENTS

Hereinafter, embodiments of the present invention will be described in more detail with reference to the drawings.

The present inventors have conducted a thorough study exploring a method that allows easy formation of a contact hole or easy establishment of direct connection between an upper wiring element and a lower wiring element. As a result, they have found that a technique of sintering a metal nanoparticle ink by light irradiation can be effectively exploited.

In the light irradiation-induced sintering technique employed in the present embodiments, high-intensity pulsed light from a flash lamp or a laser is applied to a metal nanoparticle ink printed on a substrate. This causes metal nanoparticles contained in the ink to be quickly heated to a high temperature and thus to be sintered.

First Embodiment

Figure 1:
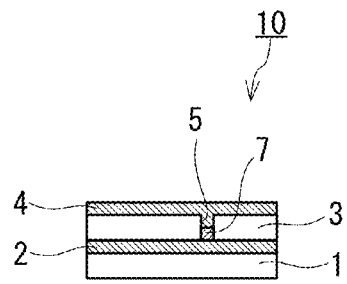
FIG. 1 is a schematic cross-sectional view of a wiring structure having a contact hole.

As shown in FIG. 1, a wiring structure 10 has a substrate 1, a lower wiring element 2, an insulating resin layer 3, an upper wiring element 4, and a contact hole 5. The lower wiring element 2, the insulating resin layer 3, and the upper wiring element 4 are arranged in this order on the substrate 1. The lower wiring element 2 and the upper wiring element 3 are separated from each other by the insulating resin layer 3. The contact hole 5 extends through the thickness of the insulating resin layer 3 and provides an electrical connection between the lower wiring element 2 and the upper wiring element 4. More specifically, the inside of the contact hole 5 is filled with a conductor 7 (via conductor), and the lower wiring element 2 and the upper wiring element 4 are electrically connected by the conductor 7.

A method for forming the wiring structure 10 shown in FIG. 1 will now be described in detail.

The lower wiring element 2 and the insulating resin layer 3 are formed in this order on the substrate 1, as shown in FIG. 2(a). The geometry and material of the substrate 1 on which the lower wiring element 2 is stacked are not particularly limited. An inorganic material such as glass, ceramic, and a metal, or an organic material such as a resin and paper, can be used as the material of the substrate 1. The method according to the present embodiment is applicable also when the substrate 1 is flexible. The geometry of the substrate 1 is not particularly limited either. For example, the substrate 1 has a flat plate-like geometry.

The method for forming the lower wiring element 2 on the substrate 1 is not particularly limited. For example, the lower wiring element 2 can be formed by applying a metal particle-containing ink onto the substrate 1 in a predetermined pattern and then sintering the applied ink. The metal particle-containing ink may be a metal paste containing metal particles having an average particle diameter on the order of micrometers or may be a metal nanoparticle ink containing metal particles having an average particle diameter on the order of nanometers. The "average particle diameter" can be calculated, for example, by the following procedures. First, the metal particles are observed with an electron microscope (SEM or TEM). A square root of an area S of a metal particle in the obtained image is defined as a particle diameter a of the metal particle ($a=S^{1/2}$). Such particle diameters a are calculated for 50 arbitrarily selected metal particles. The average of the calculated particle diameters a is defined as the average particle diameter of the primary particles of the metal particles.

The method for applying the ink for forming the lower wiring element 2 to the substrate 1 is not particularly limited. The ink can be applied to the substrate 1 by a commonly-known coating technique or printing technique. Examples of the coating technique include spin coating, bar coating, and spray coating. Examples of the printing technique include screen printing, gravure offset printing, direct gravure printing, letterpress reverse printing, and inkjet printing. It is also possible to form the lower wiring element 2 having a predetermined pattern by a commonly-known lithography technique. The pattern of the lower wiring element 2 is not particularly limited either.

The insulating resin layer 3 is not particularly limited as long as it can be stacked on the lower wiring element 2. The insulating resin layer 3 is preferably formed by film formation through coating. Examples of the resin constituting the insulating resin layer 3 include polymethyl methacrylate, polyvinylphenol, polyimide, polystyrene, polyvinyl alcohol, melamine resin, epoxy resin, benzocyclobutene resin, and olefin resin. One of these resins may be used alone, a copolymer thereof may be used, or a mixture thereof may used.

The method for forming the insulating resin layer 3 is not particularly limited. The insulating resin layer 3 can be formed, for example, by applying a solution containing a resin component and a solvent. With the use of a solution containing a resin component and a solvent, the insulating resin layer 3 with a flat surface can be formed. In terms of handling properties, efficiency, etc., it is preferable to form the insulating resin layer 3, for example, by application using spin coating, bar coating, spray coating or the like, or by printing using any of various printing devices, such as screen printing, gravure offset printing, letterpress reverse printing, and inkjet printing. It is also possible to form the insulating resin layer 3 by laminating a resin film to the substrate 1 in such a manner as to cover the lower wiring element 2.

Next, an ink 6 is placed on the insulating resin layer 3, as shown in FIG. 2(b). Specifically, the ink 6 is applied to a portion (contact hole formation portion) of the upper face of the insulating resin layer 3 where the contact hole 5 is to be formed. After the application of the ink 6, the ink 6 may be heated together with the substrate 1 to remove the solvent contained in the ink 6.

The ink 6 can be an ink that exhibits electrical conductivity upon light absorption. An ink containing fine metal particles is suitable for use as the ink that exhibits electrical conductivity upon light absorption. The use of such an ink as the conductive ink allows efficient formation of a fine wiring element. To form a uniform wiring element, it is preferable to use an ink containing fine metal particles, in particular metal nanoparticles, which have good electrical conductivity. Metal nanoparticles can show better characteristics in light absorption and in light irradiation-induced sintering.

The metal constituting the fine metal particles is not particularly limited. Available examples of the metal constituting the fine metal particles include copper, silver, aluminum, zirconium, niobium, gold, iron, nickel, cobalt, magnesium, tin, zinc, titanium, hafnium, tantalum, platinum, palladium, chromium, vanadium, and alloys of these metals. Among these, gold, silver, and copper are preferred, and particularly preferred is copper.

As the ink containing fine metal particles there can be used a commonly-known fine metal particle ink in which the fine metal particles are dispersed in an organic solvent or the like. Examples of the method for applying the ink include: application using spin coating, bar coating, spray coating, or the like; and printing using any of various printing devices, such as screen printing, gravure offset printing, direct gravure printing, letterpress reverse printing, and inkjet printing. Among these, the application by printing is more preferred. Such a printing process allows efficient and easy application of the ink without recourse to any vacuum process and is also applicable to formation of a fine wiring element.

Next, the ink 6 placed on the insulating resin layer 3 is irradiated with light to form the contact hole 5, as shown in FIG. 2(c). Specifically, the ink 6 absorbs the irradiation light to become sintered and conductive. While the ink 6 becomes conductive, heat emitted from the ink 6 locally removes that part of the insulating resin layer 3 which lies under the portion of the face to which the ink 6 is applied. In other words, a part of the insulating resin layer 3 is removed at the same time as the ink 6 is rendered conductive. This results in the formation of the contact hole 5 and the conductive sintered body 7 (conductor) located inside the contact hole 5. The sintered body 7 is in contact with the lower wiring element 2. The phrase "at the same time" is used to mean that the process in which the ink 6 becomes sintered and conductive proceeds in parallel with the process in which a part of the insulating resin layer 3 melts, decomposes, and disappears by the action of heat. There is a possibility that a decomposition product (carbon, for example) derived from the resin constituting the insulating resin layer 3 remains between the sintered body 7 and the lower wiring element 2. However, the presence of such a decomposition product in a slight amount at the interface between the sintered body 7 and the lower wiring element 2 is thought to have no significant influence on the electrical continuity between the sintered body 7 and the lower wiring element 2.

The light irradiation of the ink 6 applied as described above is preferably done using a xenon flash lamp or a laser. The use of such a pulsed light source allows the ink 6 to effectively absorb light to become sintered. By the action of heat during the light irradiation-induced sintering, only the insulating resin that lies above or under the ink 6 is melted and removed in a quick and reliable manner. This allows the formation of a tiny contact hole 5 or a fine wiring element. The energy of the irradiation light can easily be adjusted to a desired level depending on the type of the ink used.

The fact that the ink 6 is applied in a desired pattern eliminates the need for pinpoint light irradiation. For example, light may be applied to the entire surface of the substrate 1 so that the sintering of the ink 6 takes place simultaneously on different contact hole formation portions. Such a step is very simple and is applicable to a high-speed printing process such as a roll to roll process. It should be understood that light may be applied to the ink 6 in a pinpoint manner.

Finally, the upper wiring element 4 electrically continuous with the lower wiring element 2 through the contact hole 5 is formed on the upper face of the insulating resin layer 3, as shown in FIG. 2(d). The wiring structure 10 is thus obtained. The upper wiring element 4 can be formed in the same manner as the lower wiring element 2. The lower wiring element 2 and the upper wiring element 4 may be formed of the same material or may be formed of different materials.

The method of the present embodiment, as thus far described, uses an ink that exhibits electrical conductivity upon light absorption. The contact hole 5 necessary for connection between the wiring elements (lower wiring element 2 and upper wiring element 4) between which the insulating resin layer 3 is interposed can easily be formed by light irradiation-induced sintering of the ink.

The term "wiring element" is used herein to broadly encompass conductive elements such as electrodes and terminals.

Hereinafter, other embodiments of the present invention will be described. The elements common between the first embodiment and the embodiments presented below are denoted by the same reference characters in the drawings, and the description thereof may be omitted below. The features described for the first embodiment are applicable to the embodiments presented below, unless there is technical inconsistency.

Second Embodiment

In the method according to the present embodiment, the order in which the step of forming the insulating resin layer 3 and the step of applying the ink are performed is reverse to that in the method according to the first embodiment. That is, the method according to the present embodiment is one in which the ink 6 is applied to a contact hole formation portion in advance of the stacking of the insulating resin layer 3. Such a method also allows easy formation of the contact hole 5 by light irradiation-induced sintering of the ink 6, similar to the method according to the first embodiment.

Specifically, the substrate 1 having the lower wiring element 2 is prepared, as shown in FIG. 3(a). The ink 6 is then applied to a portion (contact hole formation portion) of the upper face of the lower wiring element 2 where the contact hole 5 is to be formed. After the application of the ink 6, the ink 6 is heated together with the substrate 1 to remove the solvent contained in the ink 6. This reduces the flowability of the ink 6 and thus facilitates the formation of the insulating resin layer 3.

Next, after the application of the ink 6, the insulating resin layer 3 is formed on the lower wiring element 2 to cover the lower wiring element 2 and the ink 6, as shown in FIG. 3(b). The method for forming the insulating resin layer 3 is as described in the first embodiment.

Next, the ink 6 is irradiated with light from outside of the insulating resin layer 3 to form the contact hole 5, as shown in FIG. 3(c). Specifically, the ink 6 absorbs the irradiation light to become sintered and conductive. While the ink 6 becomes conductive, heat emitted from the ink 6 locally removes that part of the insulating resin layer 3 which lies above the portion of the face to which the ink 6 is applied. This results in the formation of the contact hole 5 and the conductive sintered body 7 located inside the contact hole 5. The light irradiation of the ink 6 can be done by the means described in the first embodiment.

In the method according to the second embodiment, the ink 6 is irradiated with light from outside of the insulating resin layer 3. In other words, the yet-to-be sintered ink 6 covered by the insulating resin layer 3 is irradiated with light through the insulating resin layer 3. It is therefore necessary that any of the above-mentioned resins through which the irradiation light can be transmitted be used as the resin constituting the insulating resin layer 3. In other words, a resin transmissive to the irradiation light needs to be used as the resin constituting the insulating resin layer 3. In an example, the transmittance of the irradiation light is 80% or more at the point where the applied ink 6 is present.

Finally, the upper wiring element 4 electrically continuous with the lower wiring element 2 through the contact hole 5 is formed on the upper face of the insulating resin layer 3, as shown in FIG. 3(d). The wiring structure 10 is thus obtained.

Both the first embodiment and the second embodiment provide a method for forming the wiring structure 10 in which the upper wiring element 4 and the lower wiring element 2 between which the insulating resin layer 3 is interposed are electrically connected via the contact hole 5. The method includes the steps of: placing the ink 6 that exhibits electrical conductivity upon light absorption on the upper face of the insulating resin layer 3 or placing the ink 6 that exhibits electrical conductivity upon light absorption between the lower wiring element 2 and the insulating resin layer 3; and irradiating the ink 6 with light to render the ink 6 conductive and also to partially remove the insulating resin layer 3 by heat emitted from the ink 6 so as to form the contact hole 5.

Third Embodiment

The present embodiment differs from the first embodiment and the second embodiment in that it does not require the formation of any contact hole. The present embodiment also provides a method for forming a wiring by light irradiation-induced sintering of an ink. In the present embodiment, wiring elements between which an insulating resin layer is interposed are connected directly to form a wiring.

Specifically, the lower wiring elements 2 and the insulating resin layer 3 are formed in this order on the substrate 1, as shown in FIG. 6(a). In the example of FIG. 6(a), at least one pair of the lower wiring elements 2, 2 is formed on the substrate 1. In the example of FIG. 6(a), the lower wiring elements 2, 2 are not electrically continuous with each other; however, they may establish electrical continuity at a point not shown in the figure. The methods for forming the lower wiring elements 2 and the insulating resin layer 3 are as described in the first embodiment.

Next, the ink 6 is placed on the insulating resin layer 3, as shown in FIG. 6(b). Specifically, the ink 6 that exhibits electrical conductivity upon light absorption is applied onto the upper face of the insulating resin layer 3 formed on the lower wiring elements 2, the ink 6 serving as an upper wiring element. After the application of the ink 6, the ink 6 may be heated together with the substrate 1 to remove the solvent contained in the ink 6. When the substrate 1 is viewed in plan, the pattern drawn by the ink 6 overlaps both of the lower wiring elements 2, 2 which should be electrically continuous with each other.

Next, the ink 6 is irradiated with light as shown in FIG. 6(c). The ink 6 absorbs the irradiation light to become sintered and conductive. While the ink 6 becomes conductive, heat emitted from the ink 6 locally removes that part of the insulating resin layer 3 which lies under the portion of the face to which the ink 6 is applied. A wiring structure 12 is thus obtained. The sintered body 7 is in contact with both of the lower wiring elements 2, 2 and provides an electrical connection between the lower wiring elements 2, 2. In the wiring structure 12, an upper surface of the sintered body 7 is situated at a lower level than an upper surface of the insulating resin layer 3.

In the present embodiment, the ink 6 that exhibits electrical conductivity upon light absorption is applied to the upper face of the insulating resin layer 3 formed on the plurality of lower wiring elements 2, 2 lying in the same plane in such a manner that the ink 6 forms a pattern that overlaps the lower wiring elements 2, 2 when viewed in plan. The ink 6 is then irradiated with light to render the ink 6 conductive and also to remove a part of the insulating resin layer 3 by heat emitted from the ink 6 so as to electrically connect the lower wiring elements 2, 2 together via the sintered body 7 of the ink 6, the part of the insulating resin layer 3 lying under the portion of the face to which the ink 6 is applied. That is, according to the present embodiment, the sintered body 7 can be formed as a wiring element for providing a connection between the lower wiring elements 2, 2 lying in the same plane after the insulating resin layer 3 is formed to cover the the lower wiring elements 2, 2.

All of the methods according to the above embodiments, as thus far described, make use of light irradiation-induced sintering of an ink that exhibits electrical conductivity upon light absorption and thereby allow quick and easy establishment of connection between wiring elements between which an insulating resin layer is interposed. Such formation of a contact hole or a wiring element which makes use of light irradiation-induced sintering further has the advantage of reducing the generation of dust, such as a decomposition product derived from the insulating resin layer, which can be a cause of poor electrical continuity between the wiring elements between which the insulating resin layer is interposed.

The methods for forming a wiring according to the first to third embodiments are identical in the following respects. That is, the ink 6 that exhibits electrical conductivity upon light absorption is placed between the lower wiring element 2 and the insulating resin layer 3 or on the upper face of the insulating resin layer 3. The ink 6 is irradiated with light to sinter the ink 6 into the conductive sintered body 7, and also to partially remove the insulating resin layer 3 by heat emitted from the ink 6 so that the sintered body 7 electrically connected to the lower wiring element 2 is exposed to the outside.

The methods for forming a wiring which have been described in the first to third embodiments can be applied, for example, to production of electronic devices.

EXAMPLES

Hereinafter, the present invention will be described more specifically on the basis of examples. It should be noted that the present invention is not limited to the examples given below.

Example 1

Figure 2:
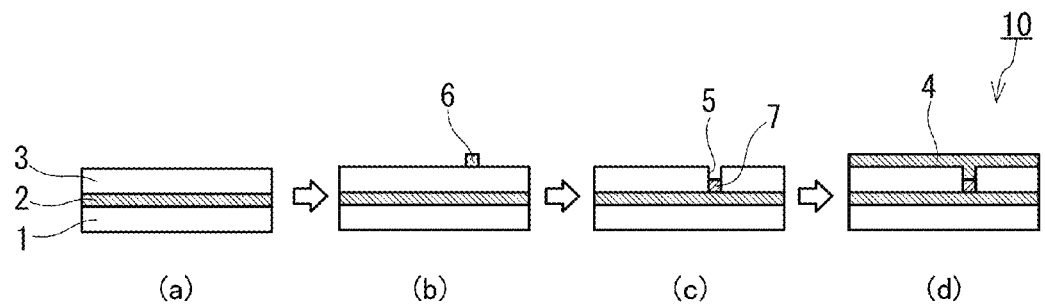
FIG. 2 shows schematic cross-sectional views illustrating a method for forming a wiring according to the first embodiment.

A wiring was formed by the method described with reference to FIG. 2. First, a silver nanoparticle ink (NPS-JL, manufactured by Harima Chemicals Group, Inc.) was printed on a glass substrate using an inkjet printer (Dimatix Material Printer DMP-2831, manufactured by Fujifilm Corporation) in a pattern with a line width of 150 μm, and this was followed by annealing at 120° C. to form a lower wiring element. A thermosetting insulating resin layer composed of a mixture of polyvinylphenol and melamine was formed as a film with a thickness of 500 nm on the lower wiring element, and was dried and cured at 150° C. Next, a copper nanoparticle ink (manufactured by ISHIHARA CHEMICAL CO., LTD.) was inkjet-printed in the shape of a dot with a diameter of about 100 μm on that part of the insulating resin layer which lay directly above the lower wiring element, and the ink was dried at 60° C. for 10 minutes. The copper nanoparticle ink was then irradiated with light using a flash lamp annealing device (manufactured by Sugawara Laboratories Inc.) and thus sintered. The conditions of the light irradiation were as follows: discharge energy=6000 J, flash duration=0.8 ms. That part of the insulating resin layer which lay under the copper nanoparticle ink was removed by heat emitted from the copper nanoparticle ink under light irradiation-induced sintering, so that a contact hole was formed in the printed dot shape. An upper wiring element was formed by inkjet-printing a silver nanoparticle ink on the copper nanoparticle sintered body inside the contact hole and on the insulating resin layer in the same manner as in the formation of the lower wiring element. Thus, a wiring structure of Example 1 was obtained.

Example 2

Figure 3:
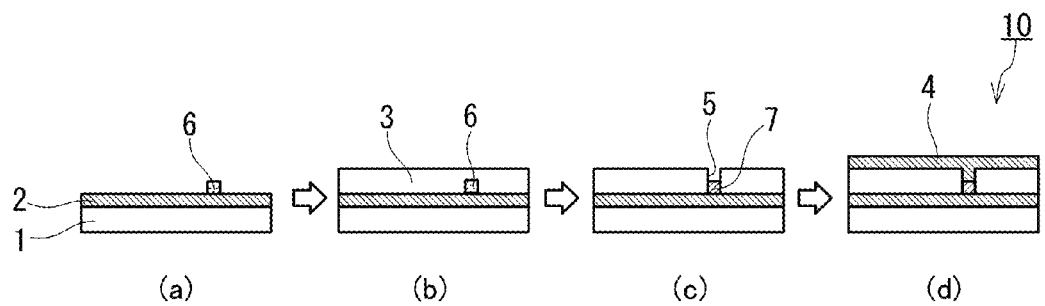
FIG. 3 shows schematic cross-sectional views illustrating a method for forming a wiring according to the second embodiment.

A wiring was formed by the method described with reference to FIG. 3. A lower wiring element was formed on a glass substrate in the same manner as in Example 1. A copper nanoparticle ink (manufactured by ISHIHARA CHEMICAL CO., LTD.) was inkjet-printed in the shape of a dot with a diameter of about 100 μm on the lower wiring element, and dried at 60° C. for 10 minutes. Next, a thermosetting insulating resin layer composed of a mixture of polyvinylphenol and melamine was formed as a film with a thickness of 500 nm on the lower wiring element on which the copper nanoparticle ink had been placed, and the layer was dried and cured at 150° C. The copper nanoparticle ink was then sintered by light irradiation in the same manner as in Example 1. That part of the insulating resin layer which lay on the copper nanoparticle ink was removed by heat emitted from the copper nanoparticle ink, so that a contact hole was formed in the printed dot shape. An upper wiring element was subsequently formed in the same manner as in Example 1. Thus, a wiring structure of Example 2 was obtained.

Comparative Example 1

Figure 4:
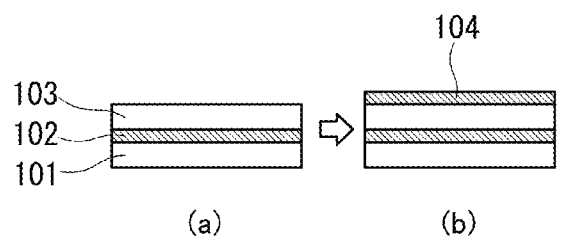
FIG. 4 shows schematic cross-sectional views illustrating a method for forming a wiring according to Comparative Example 1.

A wiring was formed by a method as illustrated in FIG. 4. A lower wiring element 102 and an insulating resin layer 103 were stacked on a glass substrate 101 in the same manner as in Example 1 (see FIG. 4(*a*)). An upper wiring element 104 was then formed on the insulating resin layer 103 in the same manner as in Example 1, without formation of any contact hole (see FIG. 4(*b*)). Thus, a wiring structure of Comparative Example 1 was obtained.

Figure 5:
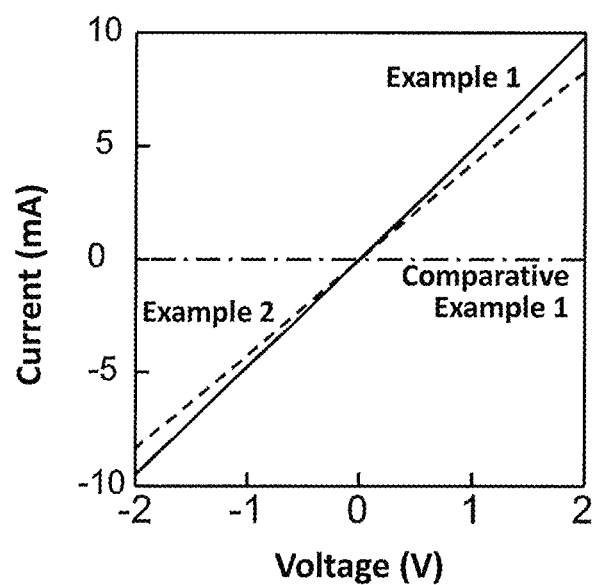
FIG. 5 is a graph representing the voltage-current characteristics between an upper wiring element and a lower wiring element for wiring structures of Example 1, Example 2, and Comparative Example 1.

For the wiring structures of Example 1, Example 2, and Comparative Example 1, the voltage-current characteristics between the upper wiring element and the lower wiring element were measured using a microammeter. A graph representing the measurement results is shown in FIG. 5. It can be seen from the graph shown in FIG. 5 that in Comparative Example 1 (dashed-dotted line) in which any contact hole was not formed, no current flowed, and the upper wiring element and the lower wiring element were insulated from each other. By contrast, in Example 1 (solid line) and Example 2 (dashed line), the current increased as the voltage became higher, which confirmed that the upper wiring element and the lower wiring element were successfully connected and electrically continuous with each other via the contact hole.

Example 3

Figure 6:
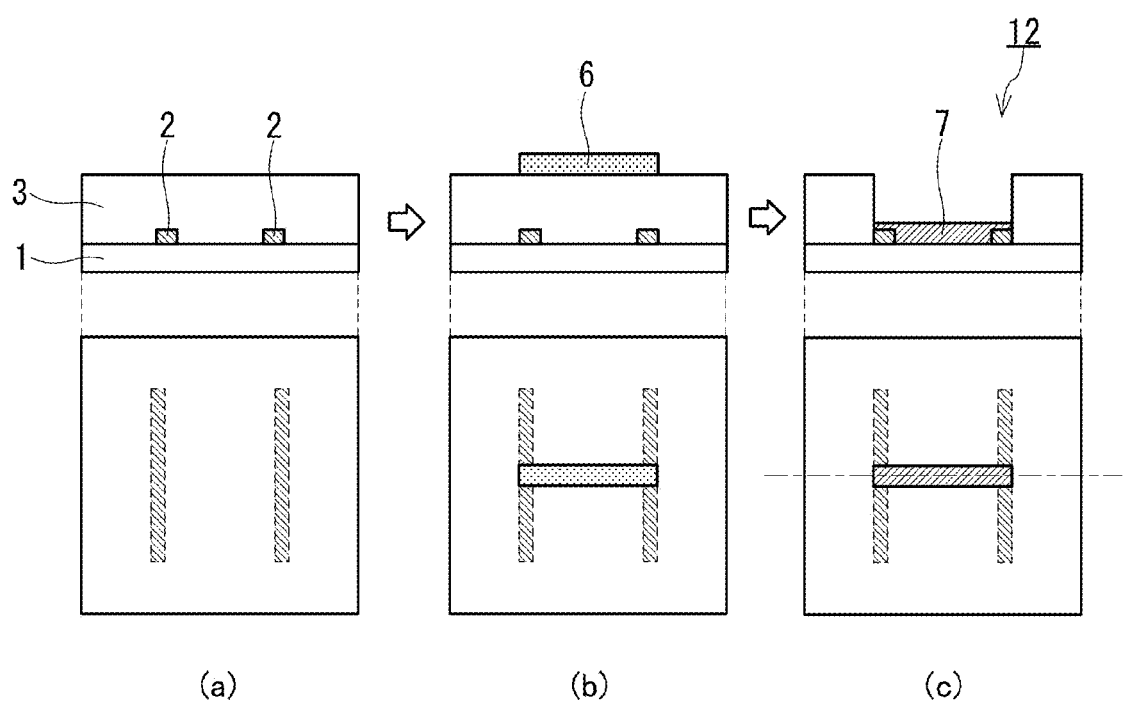
FIG. 6 shows schematic cross-sectional views (upper side) and top views (lower side) illustrating a method for forming a wiring according to the third embodiment.

A wiring was formed by the method described with reference to FIG. 6. First, a silver nanoparticle ink (NPS-JL, manufactured by Harima Chemicals Group, Inc.) was printed on a glass substrate 1 using an inkjet printer (Dimatix Material Printer DMP-2831, manufactured by Fujifilm Corporation) in a pattern of two parallel lines spaced by about 100 μm, and this was followed by annealing at 120° C. to form two line-shaped lower wiring elements. A thermosetting insulating resin layer composed of a mixture of polyvinylphenol and melamine was formed as a film with a thickness of 500 nm on the lower wiring elements, and was dried and cured at 150° C. Next, a copper nanoparticle ink (manufactured by ISHIHARA CHEMICAL CO., LTD.) was inkjet-printed into such a shape as to extend orthogonally to, and make a bridge between, the two line-shaped lower wiring elements, and the ink was dried at 60° C. for 10 minutes. The copper nanoparticle ink was then sintered by light irradiation in the same manner as in Example 1. That part of the insulating resin layer which lay under the copper nanoparticle ink was removed by heat emitted from the copper nanoparticle ink, so that the two line-shaped lower wiring elements were bridge-connected. Thus, a wiring structure of Example 3 was obtained.

Comparative Example 2

A wiring structure formed by stacking lower wiring elements and an insulating resin layer on a glass substrate in the same manner as in Example 3 was used as Comparative Example 2.

Figure 7:
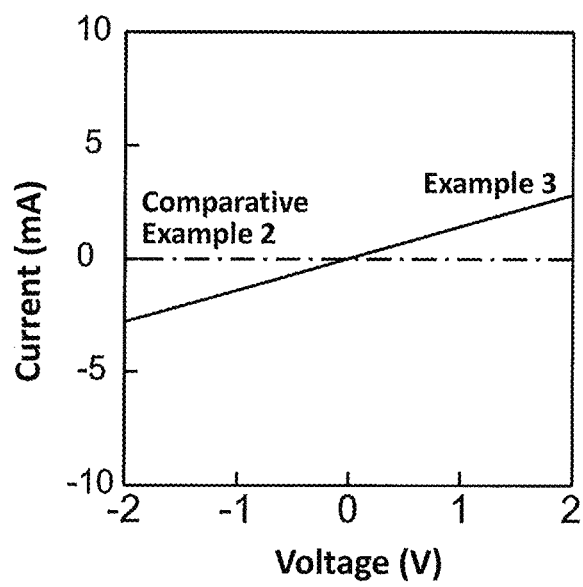
FIG. 7 is a graph representing the voltage-current characteristics between two line-shaped lower wiring elements for wiring structures of Example 3 and Comparative Example 2.

For the wiring structures of Example 3 and Comparative Example 2, the voltage-current characteristics between the two line-shaped lower wiring elements were measured using a microammeter. A graph representing the measurement results is shown in FIG. 7. It can be seen from the graph shown in FIG. 7 that in Comparative Example 2 (dashed-dotted line) in which any bridge connection was not made, no current flowed, and the lower wiring elements were insulated from each other. By contrast, in Example 3 (solid line), the current increased as the voltage became higher, which confirmed that the two line-shaped lower wiring elements were successfully bridge-connected and electrically continuous with each other via the wiring element formed from the copper nanoparticle ink.

Example 4

A silver nanoparticle ink A and a silver nanoparticle ink B were prepared by the procedures described below.

An amount of 11.5 mmol of n-octylamine, 7.5 mmol of N,N-dibutylethylenediamine, 1 mmol of oleylamine, and 62.7 μL of oleic acid were mixed for 15 minutes to prepare an amine mixture. In addition, an aqueous oxalic acid solution and an aqueous silver nitrate solution were mixed to synthesize silver oxalate.

To the amine mixture was added 2 g of the silver oxalate, and the resulting reaction liquid was stirred at 30° C. for about 15 minutes, yielding a white silver complex compound. The reaction liquid was further stirred at 110° C. for about 10 minutes. Rising of carbon dioxide bubbles took place for some minutes, after which a bluish brown suspension having silver nanoparticles dispersed therein was obtained. Methanol was added in an amount of about 10 mL to the suspension, which was subjected to centrifugation followed by removal of the supernatant. Methanol was added again in an amount of about 10 mL to the suspension, which was further subjected to centrifugation followed by removal of the supernatant. The silver nanoparticles as a precipitate were then collected. To the silver nanoparticles were added 3.31 mL of n-dodecane and 1.01 mL of n-nonanol, and thus a silver nanoparticle ink was prepared at a silver concentration of 30 wt %. Finally, the silver nanoparticle ink was passed through a filter having an aperture of 0.22 μm. In this manner, the silver nanoparticle ink A was obtained.

The silver nanoparticle ink B was prepared in the same manner as the silver nanoparticle ink A, except for using a mixed solvent of 2.56 mL of tetralin (manufactured by Tokyo Chemical Industry Co., Ltd.) and 1.01 mL of n-nonanol as the solvent of the ink.

Next, the silver nanoparticle ink A and the silver nanoparticle ink B were used to form a wiring by the method described with reference to FIG. 2. First, a thermosetting insulating resin layer composed of a mixture of polyvinylphenol and melamine was formed as an underlayer on a glass substrate. The silver nanoparticle ink B was printed on the underlayer using an inkjet printer (Dimatix Material Printer DMP-2831, manufactured by Fujifilm Corporation) in a pattern with a line width of 40 μm, and this was followed by annealing at 150° C. to form a lower wiring element. A thermosetting insulating resin layer composed of a mixture of polyvinylphenol and melamine was formed as a film with a thickness of 330 nm on the lower wiring element, and was dried and cured at 150° C. Next, the silver nanoparticle ink A was inkjet-printed in the shape of a dot with a diameter of about 100 μm on that part of the insulating resin layer which lay directly above the lower wiring element, and the ink A was dried at 40° C. for 30 minutes. The silver nanoparticle ink A was then irradiated with light using a flash lamp annealing device (manufactured by Sugawara Laboratories Inc.) and thus sintered. The conditions of the light irradiation were as follows: discharge energy=6000 J, flash duration=0.8 ms. That part of the insulating resin layer which lay under the silver nanoparticle ink A was removed by heat emitted from the silver nanoparticle ink A under light irradiation-induced sintering, so that a contact hole was formed in the printed dot shape. An upper wiring element was formed by inkjet-printing the silver nanoparticle ink B on the silver nanoparticle ink sintered body inside the contact hole and on the insulating resin layer in the same manner as in the formation of the lower wiring element. Thus, a wiring structure of Example 4 was obtained.

Figure 8A:
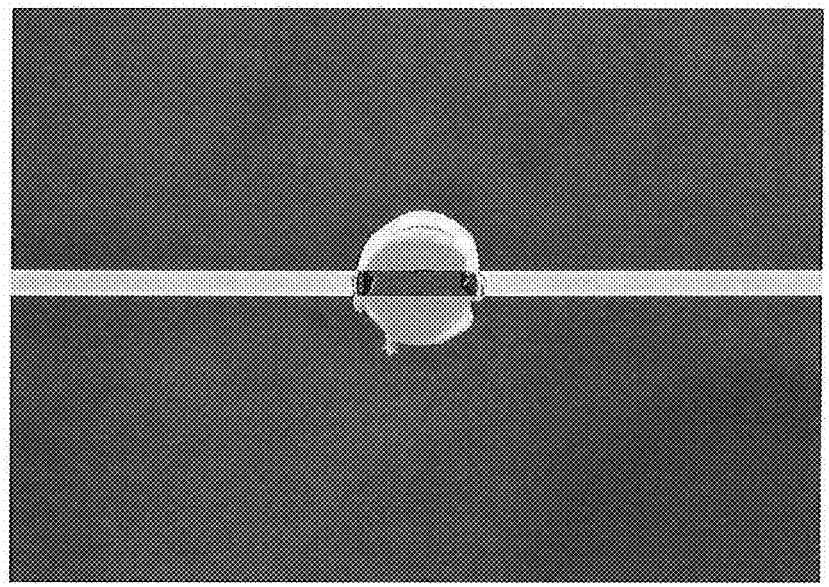
FIG. 8A is an optical photomicrograph of the upper face of a wiring structure of Example 4 taken after formation of a contact hole by light irradiation-induced sintering but before formation of an upper wiring element.
Figure 8B:
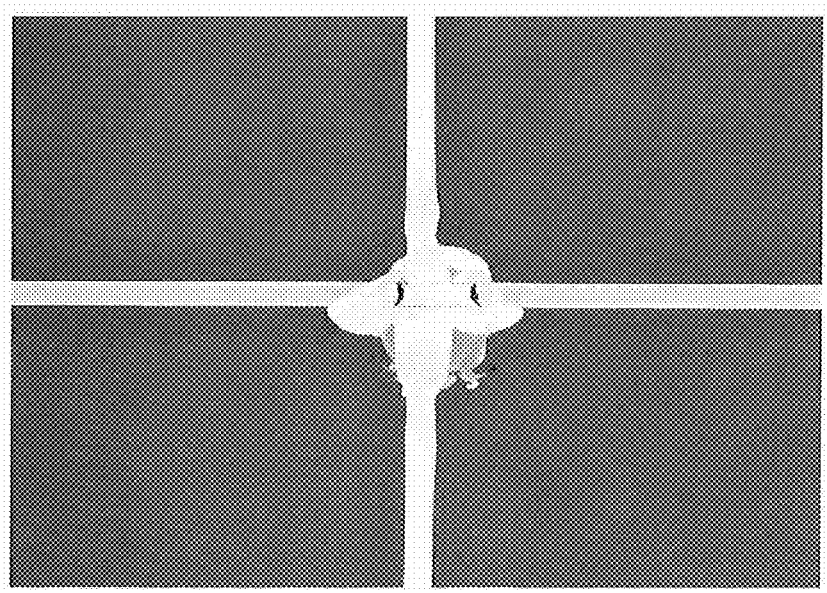
FIG. 8B is an optical photomicrograph of the upper face of the wiring structure of Example 4 taken after the formation of the upper wiring element.

FIG. 8A is an optical photomicrograph of the upper face of the wiring structure of Example 4 taken after the formation of the contact hole by light irradiation-induced sintering but before the formation of the upper wiring element. FIG. 8B is an optical photomicrograph of the upper face of the wiring structure of Example 4 taken after the formation of the upper wiring element.

Comparative Example 3

An underlayer, a lower wiring element, and an insulating resin layer were stacked on a glass substrate in the same manner as in Example 4. An upper wiring element was then formed on the insulating resin layer in the same manner as in Example 1, without formation of any contact hole. Thus, a wiring structure of Comparative Example 3 was obtained.

For the wiring structures of Example 4 and Comparative Example 3, the voltage-current characteristics between the upper wiring element and the lower wiring element were measured using a microammeter. A graph representing the measurement results is shown in FIG. 9.

Figure 9:
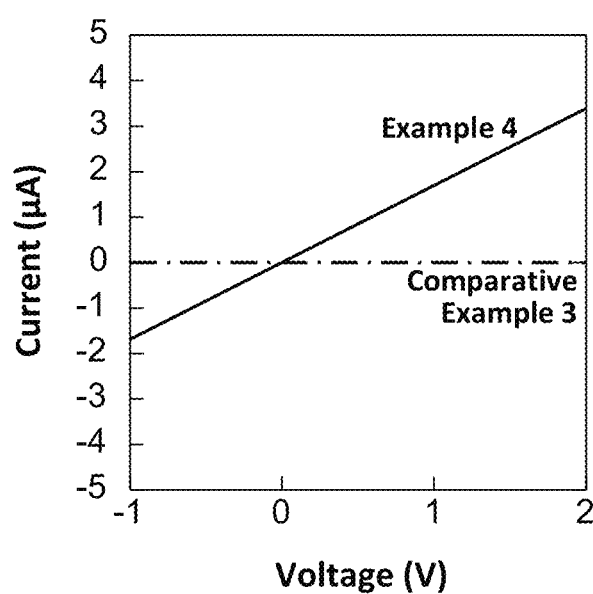
FIG. 9 is a graph representing the voltage-current characteristics between an upper wiring element and a lower wiring element for wiring structures of Example 4 and Comparative Example 3.

It can be seen from the graph shown in FIG. 9 that in Comparative Example 3 (dashed-dotted line) in which any contact hole was not formed, no current flowed, and the upper wiring element and the lower wiring element were insulated from each other. By contrast, in Example 4 (solid line), the current increased as the voltage became higher, which confirmed that the upper wiring element and the lower wiring element were successfully connected and electrically continuous with each other via the contact hole. This demonstrated that a silver nanoparticle ink can also be used to form a contact hole by any of the methods disclosed herein.

The invention claimed is:

1. A method for forming a wiring having a structure in which wiring elements between which an insulating resin layer is interposed are connected via a contact hole, the method comprising:

applying a metal nanoparticle ink that exhibits electrical conductivity upon light absorption to a contact hole formation portion of an upper face of the insulating resin layer formed on a lower wiring element; and irradiating the metal nanoparticle ink with light to render metal nanoparticles included the metal nanoparticle ink conductive and sintered by the irradiated light and also to remove a part of the insulating resin layer by heat emitted from the metal nanoparticle ink so as to form the contact hole, the part of the insulating resin layer lying under the portion of the face to which the metal nanoparticle ink is applied, wherein when the contact hole is formed, a process in which the metal nanoparticles become sintered and conductive proceeds in parallel with a process in which the part of the insulating resin layer melts, decomposes, and disappears by action of heat.

2. The method for forming a wiring according to claim 1, further comprising forming an upper wiring element on an upper face of the insulating resin layer, the upper wiring element being electrically continuous with the lower wiring element through the contact hole.

3. The method for forming a wiring according to claim 1, wherein the irradiation with light is performed using a pulsed light source.

4. The method for forming a wiring according to claim 1, wherein the irradiation with light is performed using a flash lamp or a laser.

5. The method for forming a wiring according to claim 1, wherein the application of the metal nanoparticle ink is performed by any one selected from inkjet printing, screen printing, gravure offset printing, direct gravure printing, and letterpress reverse printing.

6. The method for producing an electronic device, comprising forming a wiring by the method according to claim 1.

7. The method for forming a wiring according to claim 1, wherein the metal nanoparticle ink further comprises an organic solvent.

8. A method for forming a wiring having a structure in which wiring elements between which an insulating resin layer is interposed are connected via a contact hole, the method comprising:

applying a metal nanoparticle ink that exhibits electrical conductivity upon light absorption to a contact hole formation portion of an upper face of a lower wiring element;

forming the insulating resin layer on the lower wiring element after the application of the metal nanoparticle ink; and irradiating the metal nanoparticle ink with light from outside of the insulating resin layer to render metal nanoparticles included in the metal nanoparticle ink conductive and sintered by the irradiated light and also to remove a part of the insulating resin layer by heat emitted from the metal nanoparticle ink so as to form the contact hole, the part of the insulating resin layer lying above the portion of the face to which the metal nanoparticle ink is applied, wherein when the contact hole is formed, a process in which the metal nanoparticles become sintered and conductive proceeds in parallel with a process in which the part of the insulating resin layer melts, decomposes, and disappears by action of heat.

9. The method for forming a wiring according to claim 8, further comprising forming an upper wiring element on an upper face of the insulating resin layer, the upper wiring element being electrically continuous with the lower wiring element through the contact hole.

10. The method for forming a wiring according to claim 8, wherein the irradiation with light is performed using a pulsed light source.

11. The method for forming a wiring according to claim 8, wherein the irradiation with light is performed using a flash lamp or a laser.

12. The method for forming a wiring according to claim 8, wherein the application of the metal nanoparticle ink is performed by any one selected from inkjet printing, screen printing, gravure offset printing, direct gravure printing, and letterpress reverse printing.

13. The method for producing an electronic device, comprising forming a wiring by the method according to claim 8.

14. The method for forming a wiring according to claim 8, wherein the metal nanoparticle ink further comprises an organic solvent.

15. A method for forming a wiring by connecting wiring elements between which an insulating resin layer is interposed, the method comprising:

applying a metal nanoparticle ink that exhibits electrical conductivity upon light absorption to an upper face of the insulating resin layer formed on a lower wiring element, the metal nanoparticle ink serving as an upper wiring element; and irradiating the metal nanoparticle ink with light to render metal nanoparticles included in the metal nanoparticle ink conductive and sintered by the irradiated light and also to remove a part of the insulating resin layer by heat emitted from the metal nanoparticle ink so as to connect the lower wiring element and the upper wiring element together, the part of the insulating resin layer lying under a portion of the face to which the metal nanoparticle ink is applied, wherein when the lower wiring element and the upper wiring element are connected together, a process in which the metal nanoparticles become sintered and conductive proceeds in parallel with a process in which the part of the insulating resin layer melts, decomposes, and disappears by action of heat.

16. The method for forming a wiring according to claim 15, wherein the irradiation with light is performed using a pulsed light source.

17. The method for forming a wiring according to claim 15, wherein the irradiation with light is performed using a flash lamp or a laser.

18. The method for forming a wiring according to claim 15, wherein the application of the metal nanoparticle ink is performed by any one selected from inkjet printing, screen printing, gravure offset printing, direct gravure printing, and letterpress reverse printing.

19. The method for producing an electronic device, comprising forming a wiring by the method according to claim 15.

20. The method for forming a wiring according to claim 15, wherein the metal nanoparticle ink further comprises an organic solvent.

* * * * *